United States Patent [19]
Nakai

[11] Patent Number: 5,587,948
[45] Date of Patent: Dec. 24, 1996

[54] NONVOLATILE SEMICONDUCTOR MEMORY WITH NAND STRUCTURE MEMORY ARRAYS

[75] Inventor: Hiroto Nakai, Yokohama, Japan

[73] Assignee: Kabushiki Kaisha Toshiba, Kyoto, Japan

[21] Appl. No.: 490,167

[22] Filed: Jun. 14, 1995

[30] Foreign Application Priority Data

Jun. 17, 1994  [JP]  Japan ................... 6-135814

[51] Int. Cl.$^6$ .................................................. G11C 11/34
[52] U.S. Cl. .................. 365/185.17; 365/189.04
[58] Field of Search ..................... 365/185.11, 185.17, 365/189.04; 326/39, 41, 44

[56] References Cited

U.S. PATENT DOCUMENTS

| | | | |
|---|---|---|---|
| 4,659,948 | 4/1987 | Sunter | 326/41 |
| 5,253,206 | 10/1993 | Tanaka | 365/185.17 |
| 5,319,261 | 6/1994 | Srinivasan et al. | 326/41 |

FOREIGN PATENT DOCUMENTS 4313882  11/1992  Japan.

OTHER PUBLICATIONS

Yasuo Itoh, et al., "Nonvolatile Memories", Feb. 16, 1989 IEEE International Solid–State Circuits Conference.

*Primary Examiner*—A. Zarabian
*Attorney, Agent, or Firm*—Loeb & Loeb LLP

[57] ABSTRACT

A memory cell section is divided into a data storage area and a data management information storage area in a column direction. The number of memory cells of each of NAND strings of the data management information storage area is smaller than that of memory cells of each of NAND strings of the data storage area. Word lines are connected in common to NAND strings arranged in the column direction in the data storage area, and two of them extend to be connected in common to the NAND strings arranged in the column direction in the data management information storage area. Bit lines are connected in common to the NAND strings arranged in the row direction.

6 Claims, 9 Drawing Sheets

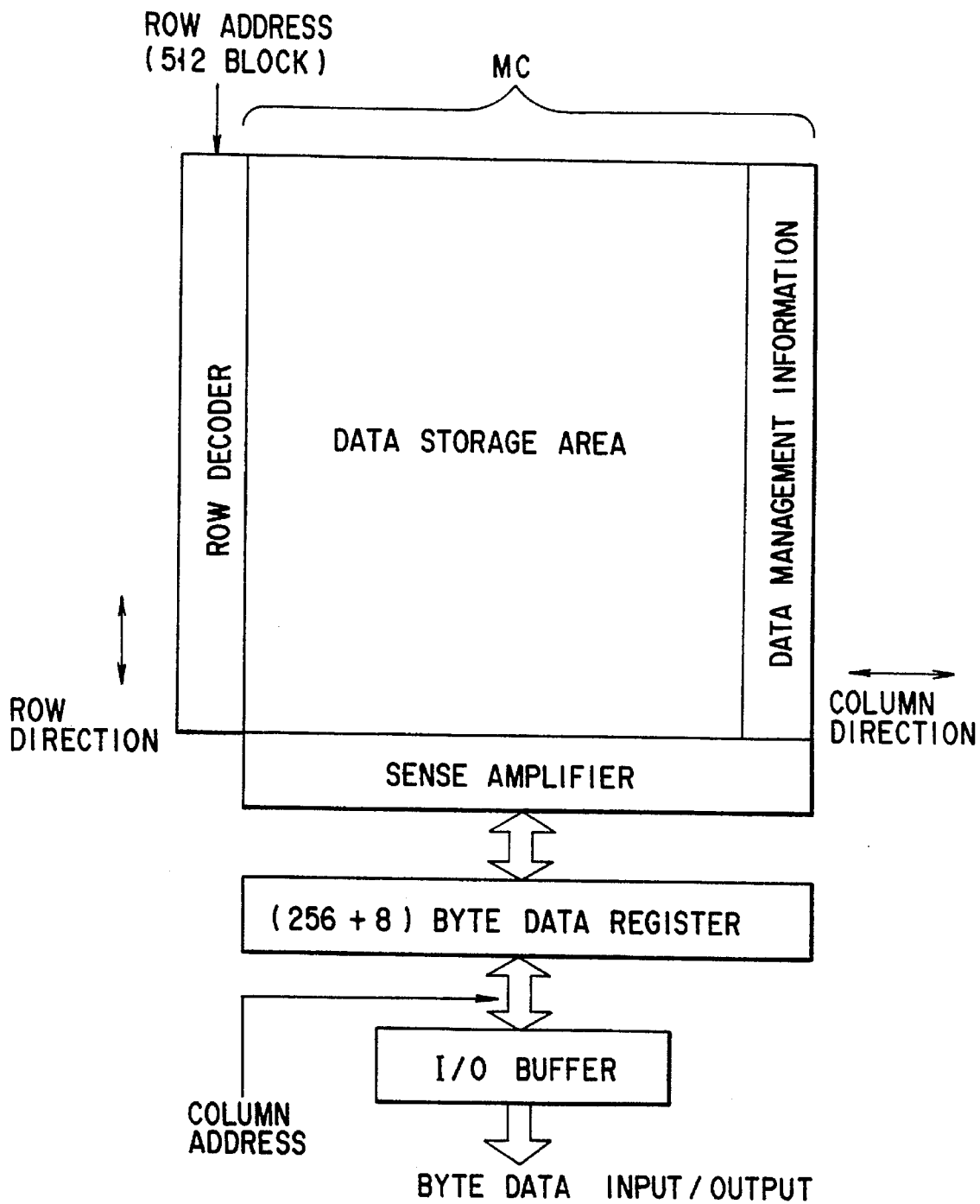
F I G. 1

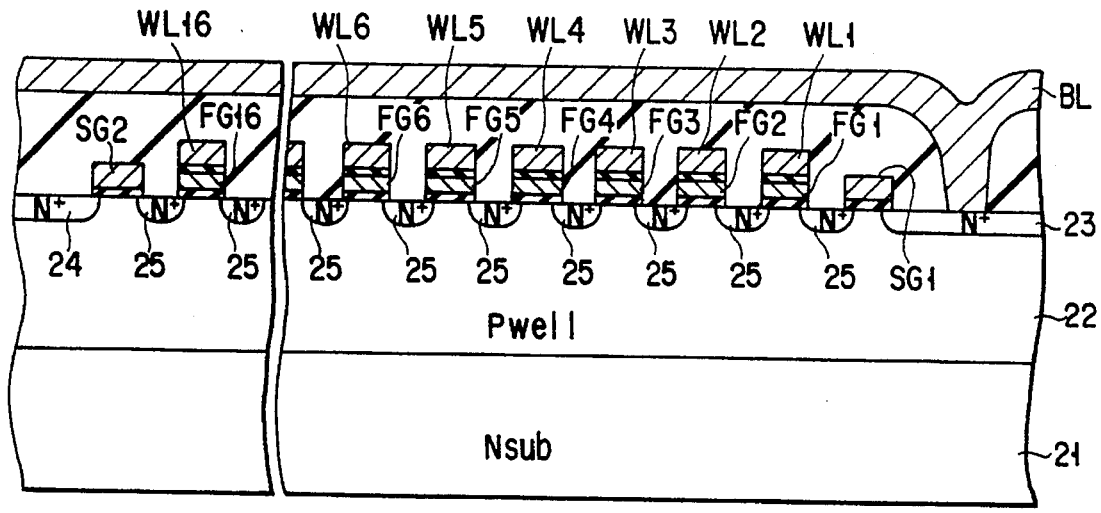
F I G. 8
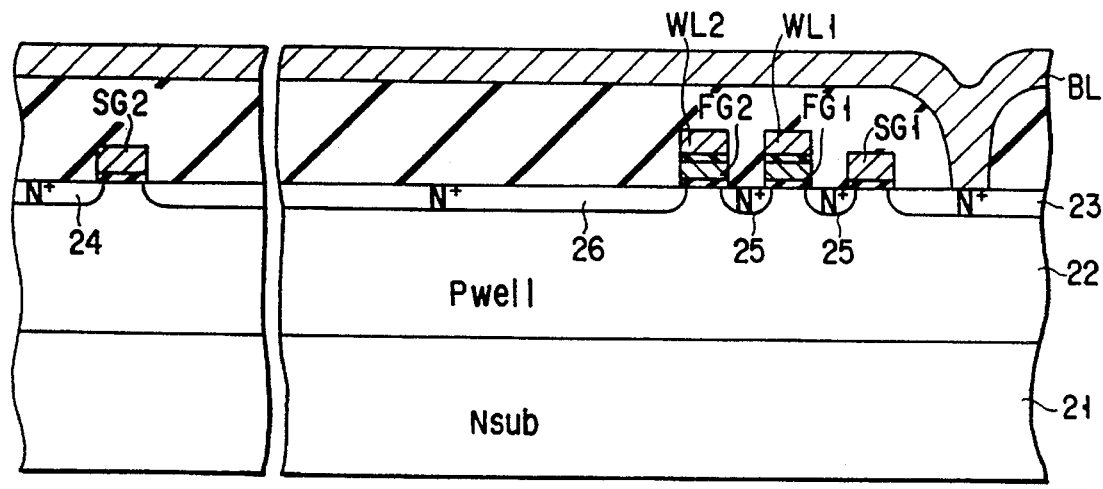
F I G. 9

NONVOLATILE SEMICONDUCTOR MEMORY WITH NAND STRUCTURE MEMORY ARRAYS

BACKGROUND OF THE INVENTION

1. Field of the Invention

The present invention relates to a NAND type flash EEPROM for storing consecutive data items, especially a memory card.

2. Description of the Related Art

NAND type flash EEPROMs, which are low-cost nonvolatile memories suitable for storing a large amount of data, have recently been employed in memory cards. A NAND type flash EEPROM includes data registers in which externally-supplied data of one page can be stored at once. The flash EEPROM is thus the most suitable for a system requiring a high-speed write operation.

There are two read modes in the NAND type flash memory. One is a random read mode in which data of one page is read from a memory cell to the data registers at once and then data of a data register of a selected column address is read outside. The read time in the random read mode is long and about 10 μsec. The other is a serial read mode in which the contents of a data register are serially read outside. The read time in this mode is very short and about 100 nsec per byte.

There have been proposed various methods of managing data stored in a memory card constituted by the flash memory described above. For example, Jpn. Pat. Appln. KOKAI Publication No. 4-313882 describes a data management method suitable for storing image information. A stored information map representing such a data management method is shown in FIG. 12 of the present application. According to this method, part of a memory chip is used as a data management information storage area, and the other part is used as a data storage area.

In Japanese Publication No. 4-313882, a packet number (image number), a card number, a data type, a reserve area, a next-cluster number, etc. are stored as data management information. The read and write operations are performed by reading the data management information out of the data management information storage area. More specifically, data is read out from a data storage area indicated by the management information, while data is written to an empty data storage area retrieved by the management information. In this data management, however, the number of times of rewriting of management information stored in the data management information storage area is considerably larger than that of rewriting of data stored in the data storage area, and the time required to reach the limit of the number of times of rewriting in the former case is shorter than in the latter case. Consequently, the lifetime of a card depends upon the number of times of rewriting of management information stored in the data management information storage area.

The data management method of Japanese Publication No. 4-313882 is shown in FIG. 13. According to this method, a memory area is divided into a cluster section for storing data and a header section for storing management information. In the erase mode, data of the cluster section and management information of the header section are both erased. In the write mode, data is written to the cluster section and data management information is written to the header section. This constitution of the memory area prevents data from being rewritten locally to the data management information storage area, and eliminates the disadvantage that the number of times of rewriting of data stored in the data management information storage area reaches its limitation more quickly.

If, however, the data management method of the Japanese Publication is applied to a memory card using the foregoing NAND type flash EEPROM, the following drawbacks will occur.

As described above, the read operation is performed by referring to management information for accessing data, which is acquired by searching the data management information storage area (header section). When the NAND type flash EEPROM is employed and if one cluster section and information of the header section is constituted in correspondence to one-block data, data of the cluster section and information of the header portion can be erased at once and the rewrite efficiency is improved.

Since the respective header sections are arranged at different pages, management information has to be read out from each of the header sections page for every page in order to retrieve header information, and readout time of about 10 μsec is required for each page.

Assume that a 16-Mbit NAND type flash EEPROM is employed in which one page is 256 bytes and one block includes 16 pages, and one cluster includes 15 pages and the header section (of 16-byte information) does one page. Let us consider the time required for sequentially reading the data out of the header section.

If only the header sections of a 16-Mbit chip including 512 cluster sections are accessed in sequence using a data management method as shown in FIG. 13, the read time of 5939.2 μsec (=512×10 μsec±100 nsec×16×512) is needed. If one cluster is constituted by 16 pages using a conventional data management method as shown in FIG. 12, the header section has only to secure an area of 16 bytes×512 clusters=8 K-bytes (2 blocks), and the read time for the header section is 32×10 μsec+100 nsec×256×32=1139.2 μsec.

As described above, if the data management method as shown in FIG. 13 is employed in order to prevent management information of the data management information storage area from being locally rewritten, the read time of about 5 msec is required to search for the header section. On the other hand, if the data management method as shown in FIG. 12 is adopted, the number of times of rewriting of data stored in the data management information storage area becomes larger than that of rewriting of data stored in the data storage area, and the lifetime of a chip, which depends upon the number of times of rewriting of data stored in the data management information storage area, is shortened.

SUMMARY OF THE INVENTION

The present invention has been developed in order to resolve the above problem and its object is to provide a NAND type flash EEPROM wherein the lifetime of a chip is lengthened without depending upon the number of times of rewriting in a data management information storage area, and the read, write and erase operations can be performed at high speed by retrieving data from the data management information storage area for a short time.

To attain the above object, there is provided a nonvolatile semiconductor memory comprising: a first array area including a plurality of first NAND strings arranged in matrix, each of the NAND strings having i memory cells which are connected in series and electrically erasable and programmable; a second array area including a plurality of second NAND strings arranged in matrix, each of the NAND strings having j memory cells which are connected in series and electrically erasable and programmable, said j memory cells being smaller in number than said i memory cells; a plurality of bit lines connected to said plurality of first NAND strings arranged in a first direction in said first array area; a plurality of bit lines connected to said plurality of second NAND strings arranged in the first direction in said second array area; a plurality of word lines connected to said plurality of first and second NAND strings arranged in a second direction perpendicular to the first direction in said first and second array areas; and decoding means for selecting one of the memory cells from said first and second NAND strings connected to the bit lines.

The first and second NAND strings each include a select gate transistor between a memory cell and a bit line, and a select gate transistor between a memory cell and a source line. The first and second array areas are contiguous to each other.

Some of the plurality of word lines are connected in common to one of the memory cells of the first and second NAND strings arranged in the second direction, and the others thereof are connected in common to one of the memory cells of only the first NAND strings arranged in the second direction.

The first array area is interposed between the decoder and the second array area, and some of the plurality of word lines extend from the decoder to the second array area, while the others thereof extend from the decoder and terminate on the first array area.

The plurality of word lines arranged in the second direction include j word lines connected in common to one of the memory cells of the first and second NAND strings and (i–j) word lines connected in common to one of the memory cells of only the first NAND strings.

The nonvolatile semiconductor memory further comprises a circuit for performing read, write and erase operations at once with respect to the memory cell of one of the first and second array areas selected by the decoder.

According to the above constitution, one NAND string of the data storage area includes i memory cells connected in series, and one NAND string of the data management information storage area includes j memory cells connected in series. The number of j memory cells is smaller than i memory cells. The data management information storage area is provided in each block of the data storage area capable of erasing data at once. Consequently, the lifetime of a chip is lengthened since it does not depend upon the number of times of rewriting of data in the data management information storage area. Furthermore, since data of the data management area can be read out at high speed, it can be retrieved in a short time, thus achieving high-speed read, write and erase operations.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram schematically showing the major part of a nonvolatile semiconductor memory according to an embodiment of the present invention;

FIG. 5 is a table of control signal voltages in read, write and erase modes;

FIG. 8 is a cross-sectional view taken along the line of VIII—VIII of FIG. 7;

FIG. 9 is a cross-sectional view taken along the line of VIIII—VIIII of FIG. 7;

DETAILED DESCRIPTION OF THE PREFERRED EMBODIMENTS

A nonvolatile semiconductor memory according to the present invention will now be described with reference to the accompanying drawings.

FIG. 1 is a block diagram showing the constitution of the major part of a NAND type flash EEPROM according to an embodiment of the present invention.

Referring to FIG. 1, a row decoder is provided at one end of a memory cell section MC in a column direction, and a sense amplifier is arranged at one end thereof in a row direction. The memory cell section MC is divided into two areas in the column direction. One of the areas is a data storage area, while the other is a data management information storage area. The memory cell section MC can be divided into several areas in the column direction, and these areas can be used as data storage areas and data management information storage areas properly. In other words, a data management information storage area can be arranged either at one end of a data storage area in the column direction or between data storage areas.

Figure 2:
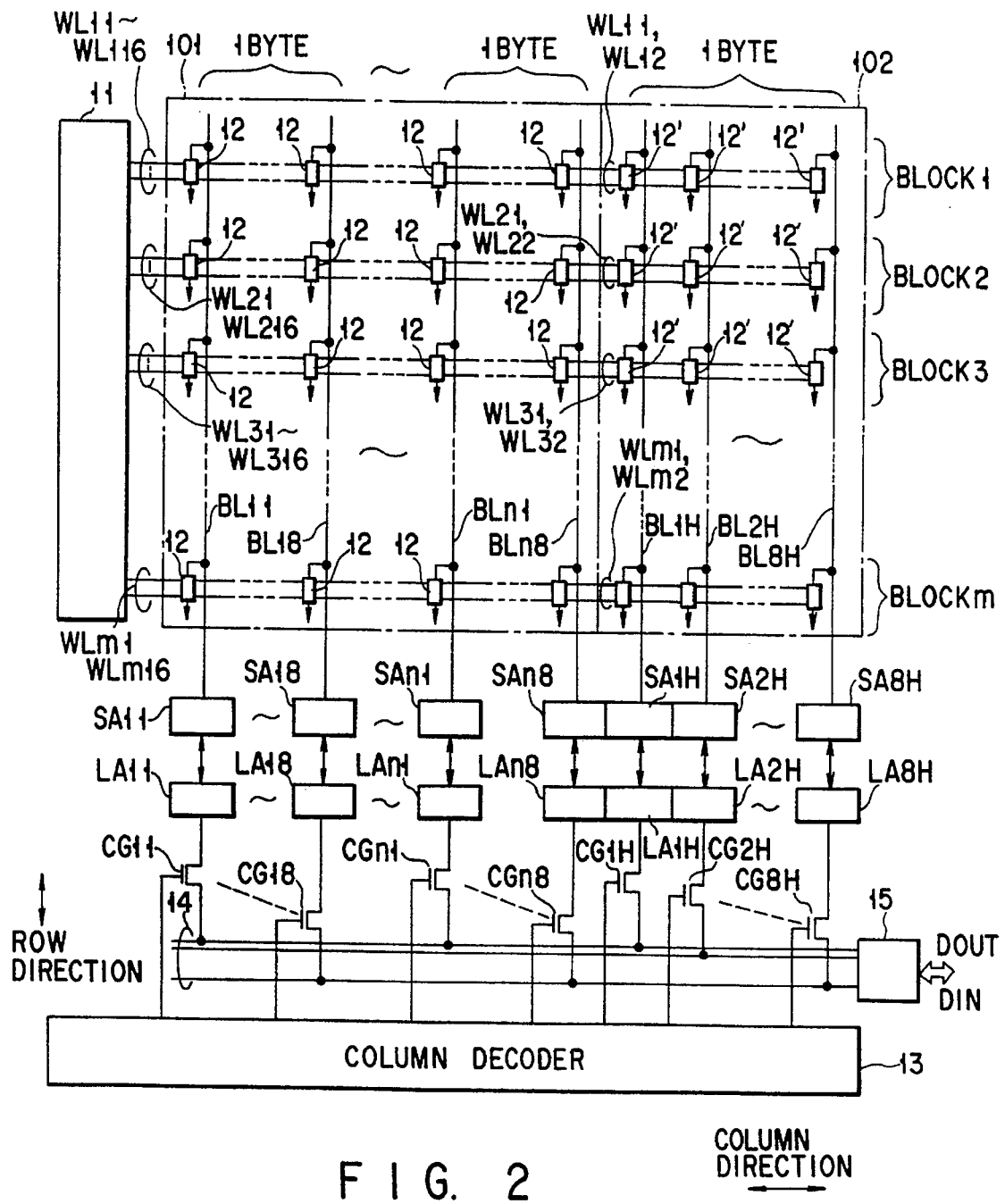
FIG. 2 is a view showing in detail the major part of the memory of FIG. 1.

FIG. 2 shows in detail the arrangement of the major part of the NAND type flash EEPROM of FIG. 1.

As shown in FIG. 2, the memory cell section MC is divided into two areas in the column direction, that is, a data storage area 101 alongside a row decoder 11 (on the left-hand side of the figure) and a data management information storage area 102 (on the right-hand side thereof). The data storage area 101 is divided into n (e.g., 256) subareas in the column direction, and each subarea includes, for example, eight bit lines to form one byte. The data management information storage area 102 also includes, for example, eight bit lines to form one byte.

The memory cell section MC is divided into m (e.g., 512) subareas in the row direction, and each subarea includes, for example, sixteen word lines to constitute one block. The block has a plurality of NAND strings 12 arranged in the column direction, and the constitution thereof is shown in detail in FIG. 3.

The data storage area 101 includes electrically programmable erasable memory cells each having a floating gate. These memory cells are formed at nodes between (n bytes× 8) bit lines BL11 to BL18, . . . , BLn1 to BLn8 and (m blocks×16) word lines WL11 to WL116, . . . , WLm1 to WLm16.

Figure 3:
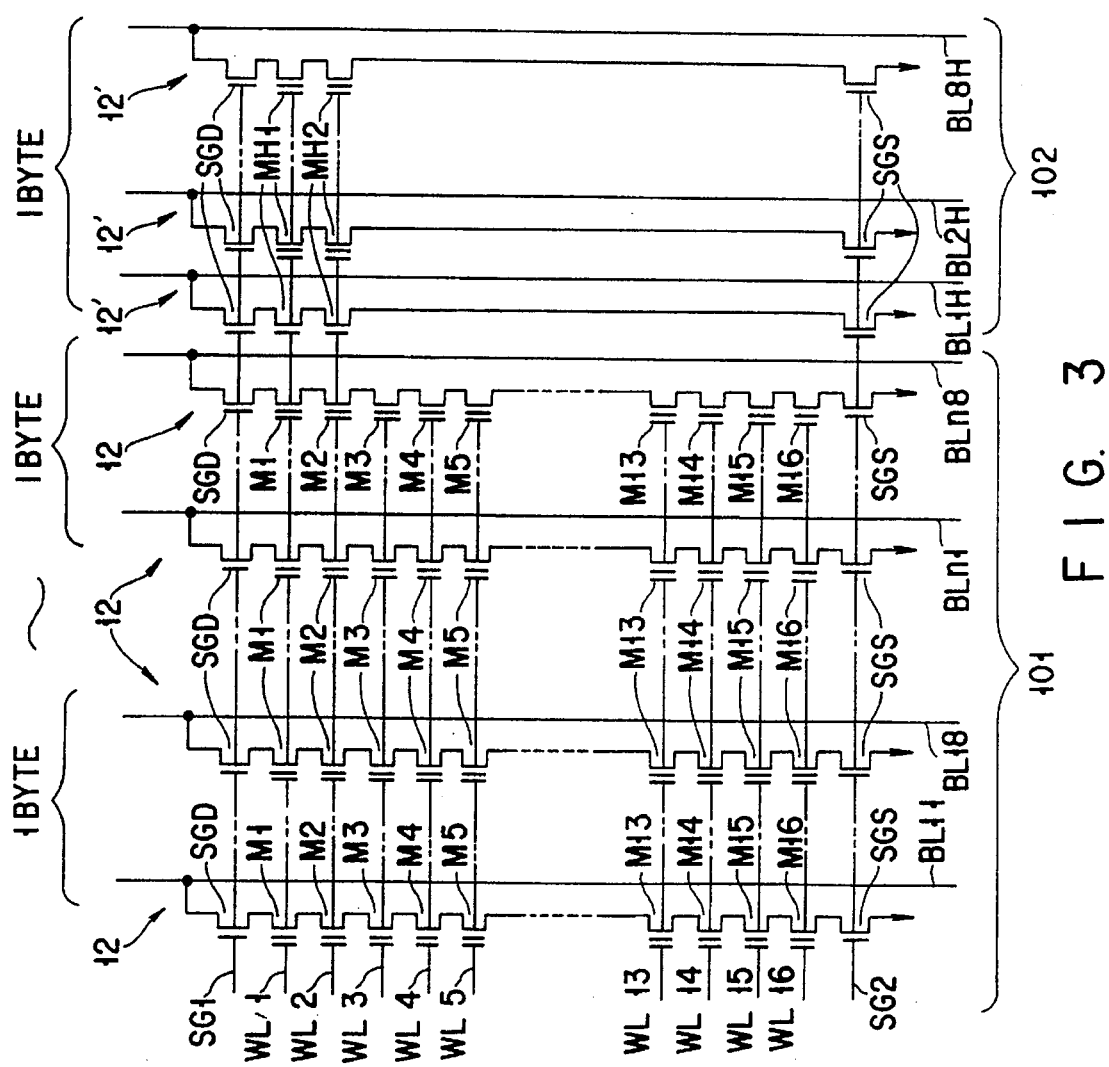
FIG. 3 is a view showing in detail one block of the memory of FIG. 2.

FIG. 3 shows the constitution of one block of the memory cell section MC in detail.

Referring to FIG. 3, in the data storage area 101, one NAND string 12 includes i memory cells, e.g., sixteen memory cells M1 to M16, and the gates of these memory cells are connected to their respective word lines WL1 to WL16.

The drain-to-source current paths of the memory cells M1 to M16 the gates of which are connected to the word lines WL1 to WL16, are connected in series. One end of a current path of a select gate transistor SGD is connected to the drain of one endmost memory cell M1 of the series-connected memory cells. The other end of the current path of the transistor SGD is connected to the bit line BL of the NAND string 12. Furthermore, one end of a current path of a select gate transistor SGS is connected to the source of the other endmost memory cell M16. The other end of the current path of the transistor SGS is connected to a ground line.

In short, one NAND string 12 is constituted of two select gate transistors SGD and SGS connected between the bit line and ground line, and sixteen memory cells M1 to M16 connected between these transistors. In the data storage area 101, the NAND strings 12 corresponding to the blocks (m=512 in this embodiment) are connected to one bit line.

In the data management information storage area 102, one NAND string 12' includes j memory cells, e.g., two memory cells MH1 and MH2, which are less than i memory cells. The gates of the memory cells MH1 and MH2 are connected to the word lines WL1 and WL2, respectively.

The drain-to-source current paths of the memory cells MH1 and MH2 the gates of which are connected to the word lines WL1 and WL2, are connected in series to each other. One end of a current path of a select gate transistor SGD is connected to the drain of the memory cell MH1, while the other end of the current path thereof is connected to the bit line BL of the NAND string 12'. One end of a current path of a select gate transistor SGS is connected to the source of the memory cell MH2, while the other end of the current path thereof is connected to a ground line.

In short, one NAND string 12' is constituted of two select gate transistors SGD and SGS connected between the bit line and ground line, and two memory cells MH1 and MH2 connected between these transistors. In the data management information storage area 102, the NAND strings 12' corresponding to the blocks (m=512 in this embodiment) are connected to one bit line.

Referring again to FIG. 2 which shows the constitution of the major part of the NAND type flash EEPROM, the bit lines BL11 to BL18, . . . , BLn1 to BLn8 are connected to their corresponding sense amplifiers SA11 to SA18, . . . , SAn1 to SAn8. In a page read mode, the data stored in the memory cells sensed by the sense amplifiers, are latched by latch circuits LA11 to LA18, . . . , LAn1 to LAn8 corresponding to the sense amplifiers. In a byte data read mode, the data latched by the latch circuits are output to an I/O bus 14 in units of byte through those (e.g., CG11 to CG18) of column gate transistors CG11 to CG18, . . . CGn1 to CGn8 which are selected by the column decoder 13, and then supplied from an I/O buffer circuit 15 outside a memory chip. In a write mode, 256-byte data are input in sequence byte by byte through the I/O buffer circuit 15, and stored in the predetermined latch circuits LA11 to LA18 through the column gate transistors (e.g., CG11 to CG18) selected by the column decoder 13.

The potentials of the bit lines BL11 to BL18, . . . , BLn1 to BLn8 are determined by the data stored in the latch circuits. If input data is "1", the potentials are set to ½ Vpp. If input data is "0", they are set to 0 V. In the write mode, the potential of one word line selected by the row decoder 11 is set to Vpp. The potential of the gate of the select gate transistor SGD in the NAND string 12 including the selected word line is set to about ½ Vpp, as are the potentials of the non-selected fifteen word lines.

The potential of the gate of the select gate transistor SGS is set to 0 V. As a result, when input data is "1", an electric field of about ½ Vpp is applied between the gate and channel of a memory cell in which input data "1" is stored. Thus, the memory cell is not rendered in a write state but remains in an erase state. When input data is "0", an electric field of Vpp is applied between the gate and channel of a memory cell. Thus, electrons are injected into a floating gate of the memory cell, and the memory cell changes from the erase state to the write state.

The gate potentials of the select gate transistors SGD and SGS of the other NAND strings 12, i.e., non-selected NAND strings 12, are all set to 0 V so as to prevent data from being written.

An erase operation will now be described.

In the erase mode, the potentials of all word lines of a selected block are set to 0 V, and those of all word lines of the non-selected blocks are set to Vpp. Since the substrate potentials of the memory cells are set to Vpp at the same time, electrons are emitted from the floating gates of memory cells of the selected block to the substrates, and the memory cells of the selected block are all rendered in the erase state. Since, furthermore, the potentials of gates and substrates of all memory cells of the non-selected blocks are set to Vpp, there occurs no difference in potential between the gates and substrates, with the result that the memory cells maintain data which is not to be erased.

Figures 4, 6:
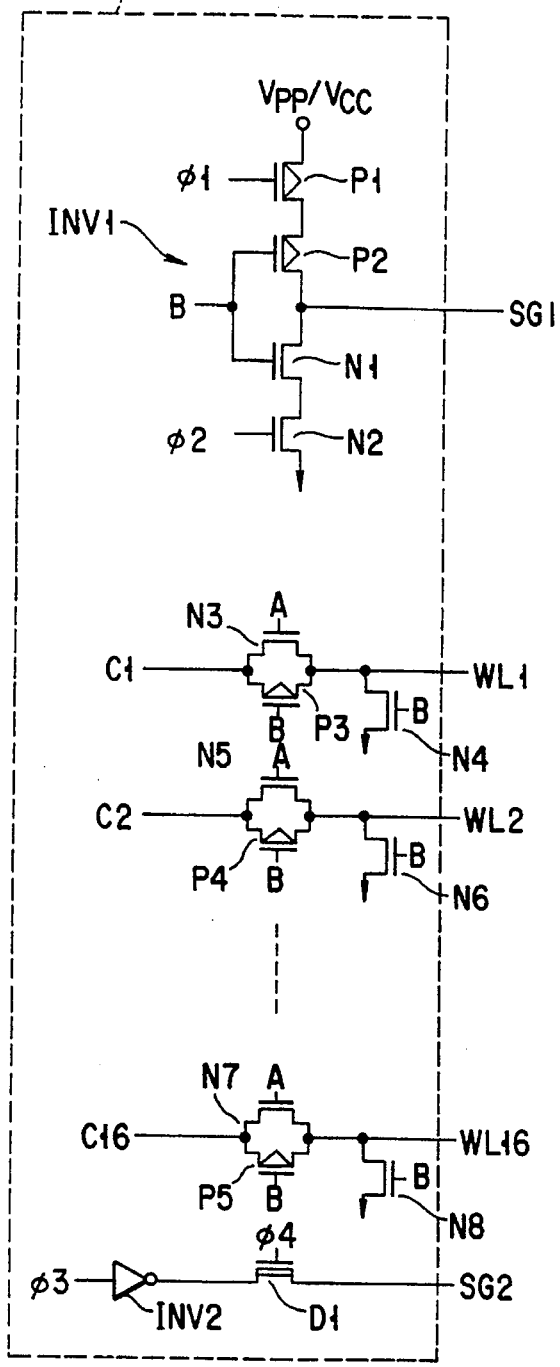
FIG. 4 is a view showing in detail a row decoder of FIG. 2.
FIG. 6 is also a table of control signal voltages in read, write and erase mode.

FIG. 4 shows an arrangement of a row decoder circuit for driving the gates of select gate transistors and those of memory cells in a single NAND string. The row decoder circuit corresponds to one block, and m (e.g., 512) row decoder circuits constitute the row decoder 11 shown in FIG. 2. In other words, the row decoder 11 selects NAND string 12 of one block of the data storage area and NAND string 12' of one block of the data management information storage area, and selects one memory cell of each of the NAND strings.

In P-channel MOS transistors P1 to P5, the substrate potential changes to $V_{DD}$ in the read mode and to $V_{PP}$ in the write/erase mode. An inverter INV1 constituted of the P-channel MOS transistors P1 and P2 and N-channel MOS transistors N1 and N2 outputs a signal through a select gate line SG1 (from the drain side or bit line side).

One end of the current path of a depletion type MOS transistor D1 whose threshold value is negative, is connected to an output of an inverter circuit INV2 operated at a $V_{DD}$ power supply voltage, and the other end thereof is connected to a select gate line SG2 (source side).

In N-channel MOS transistors N1 to N8, the substrate potential is 0 V, and the threshold value is positive. FIG. 5 shows voltages of control signals φ1 to φ4, A and B for driving the row decoder circuit in the read, write and erase modes. The voltages are applied to the select gates and word lines in each of the read, write and erase modes.

FIG. 6 shows voltages of control signals C1 to C16 in the case where a certain word line of a NAND string is selected in the respective (read, write and erase) modes. The foregoing row decoder circuit for performing a decoding operation in response to an internal address signal, has been known conventionally.

According to the embodiment shown in FIGS. 1 to 3, the memory cell section includes the data storage area 101 having blocks each of 4 K-bytes and the 4-byte data management information storage area 102. However, the ratio of the size of area 101 to that of area 102 can be varied by changing the relative ratio of memory cell arrays in the column direction.

As is illustrated in FIGS. 2 and 3, the data management information storage area 102 includes electrically programmable erasable memory cells each having a floating gate and arranged at the nodes of eight bit lines (1 byte) BL1H to BL8H and 1024 (=512×2) word lines WL11 to WL116, ..., WLm1 to WLm16. One NAND string 12' of the area 102 is constituted by two memory cells MH1 and MH2 and select gate transistors SGD (drain side) and SGS (source side) which are connected in series between the bit and source lines. The gate electrode of memory cell MH1 and that of memory cell M1 of the data storage area 101 are connected in common to the word line WL1, while the gate electrode of memory cell MH2 and that of memory cell M2 of the data storage area 101 are connected in common to the word line WL2. The source electrode of memory cell MH2 on the source side is connected to the drain electrode of select gate transistor SGS on the source side. The gate electrodes of select gate transistors SGD and SGS in the NAND string 12' of the data management information storage area 102, and those of select gate transistors SGD and SGS, are connected in common to the select gate lines SG1 and SG2.

Figure 7:
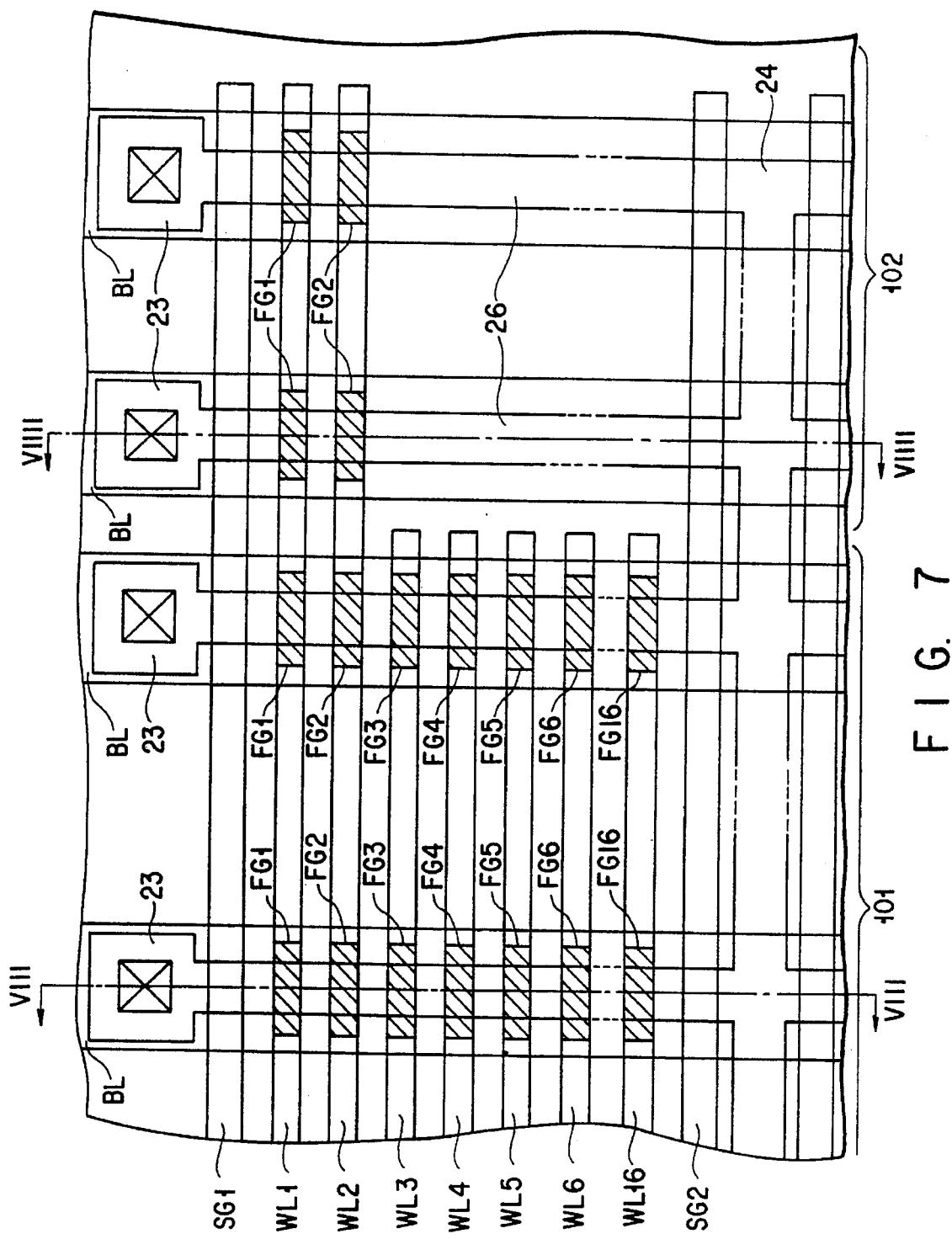
FIG. 7 is a view of a plan pattern of one block of the memory shown in FIG. 2.

FIG. 7 shows a pattern for forming select gate transistors and memory cells on a silicon substrate. FIG. 8 is a cross-sectional view taken along the line VIII—VIII of FIG. 7, and FIG. 9 is a cross-sectional view taken along the line VIIII—VIIII of FIG. 7.

A p-type well region 22 is formed in a surface region of an n-type silicon substrate 21, and sixteen memory cells M1 to M16 connected in series are formed in the well region 22. While a select gate transistor SGD is formed at one end of a series of the memory cells, a select gate transistor SGS is formed at the other end thereof.

In one block, sixteen word lines WL1 to WL16 extend from the row decoder circuit. These word lines are formed of polysilicon. Floating gates FG1 to FG16 are formed directly under the nodes (where memory cells are formed) between the word lines WL1 to WL16 and SGD areas (where no string isolation field oxide films are formed) within the data storage area (FIG. 8). The floating gates FG1 to FG16 are formed of polysilicon.

Also, in one block, two select gate lines SG1 and SG2 as well as the word lines WL1 to WL16, extend from the row decoder circuit. These select gate lines are formed of polysilicon. No floating gates are formed right under the nodes between the select gate lines SG1 and SG2 and the SGD areas. Thus, select gate transistors SGD and SGS serve as normal MOS transistors.

The two word lines WL1 and WL2 extend to the data management information storage area 102 contiguous to the data storage area 101. The floating gates FG1 and FG2 are formed of polysilicon and arranged directly under the nodes of the word lines WL1 and WL2 and the SDG areas of the data management information storage area (FIG. 9).

The two select gate lines SG1 and SG2 also extend to the data management information storage area 102. Select gate transistors SGD and SGS, which have no floating gates and thus serve as normal MOS transistors, are formed directly under the nodes of the select gate lines SG1 and SG2 and the SGD areas in the data management information storage area 102.

In the data storage area 101 and data management information storage area 102, the drain terminal of the select gate transistor SGD is formed by an N+-type diffusion layer 23 and connected to the bit line of aluminum through a contact hole. The source terminal of the select gate transistor SGS is formed by an N+-type diffusion layer 24 and connected to the source line of aluminum through a contact hole. Between the respective memory cells MC1 to MC16 and select gate transistors SGD and SGS, N+-type diffusion layers 25 are formed to serve as sources or drains.

The fourteen word lines WL3 to WL16 terminate in the data storage area 101, and neither word lines nor floating gates are present between the word line WL2 and select gate line SG2 in the data management information storage area 102. The source terminal of a memory cell transistor formed by the word line WL2 is connected to the drain terminal of the select gate transistor SGS (source side) by an N+-type diffusion layer 26.

Refer again to the constitution of the major part of the NAND type flash EEPROM shown in FIG. 2. The eight bit lines BL1H to BL8H of the data management information storage area 102 are connected to their corresponding sense amplifiers SA1H to SA8H. When data management information (management data) is read out, data stored in memory cells sensed by the sense amplifiers SA1H to SA8H are latched by latch circuits LA1H to LA8H corresponding to the sense amplifiers.

When management data is read out of the data management information storage area 102, a block address and a page address are externally supplied first. One of m (e.g., 512) blocks is selected by the block address, and one of word lines WL1 and WL2 is selected by the page address. The selected word line is set to 0 V, and the remaining fifteen word lines of a block of the selected word line are set to power supply voltage $V_{DD}$, as are the two select gate lines of the block of the selected word line.

The above operating conditions are the same as those in the case where a memory cell whose gate is connected to the word lines WL1 and WL2 in the data storage area 101. The row decoder and peripheral circuit (not shown) for driving the row decoder are the same as those of a prior art memory chip including no data management information storage areas.

As in the case where a memory cell of the data storage area 101 is selected based on the management data of eight memory cells whose gates are connected to the selected word line, the potentials of the bit lines BL1H and BL8H are determined, and the management data is read out via column gate transistors CG1H to CG8H.

In the foregoing embodiment of the present invention, the NAND string 12' of the data management information storage area 102 is constituted of two memory cells and two select gate transistors. If, therefore, a memory cell in the erase state is selected, the current flowing through the memory cell is larger than that flowing through a memory cell selected from the data storage area 101. The current flowing through the memory cell serving as a MOS transistor becomes smaller as the source potential increases because of substrate bias effect. The more the memory cells connected between the selected memory cell and source select gate, the smaller the current flowing through the memory cell. For example, the current flowing through two memory cells connected in series is about ten times as large as the current flowing through sixteen memory cells connected in series, with the result that the potential of bit lines of the data management information storage area 102 varies about ten times faster than that of bit lines of the data storage area 101.

Figure 10:
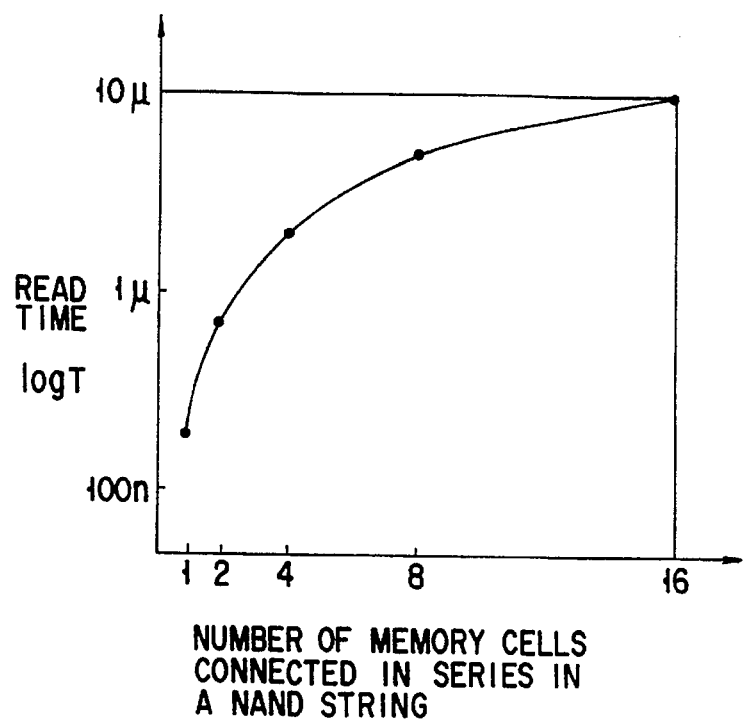
FIG. 10 is a graph showing the relationship between the number of memory cells in a single NAND string.

FIG. 10 shows the relationship between the number of memory cells connected in series in one NAND string and the time required to vary the potential of the bit line having a capacity of about 2 pF by several volts. It is apparent from FIG. 10 that the read time of 10 μsec or more is required when one NAND string is constituted of sixteen memory cells, while it can be reduced to 1 μsec or less when one NAND string is constituted of two memory cells.

In the data management information read mode, the memory cell data of the data management information storage area 102 is read out by the sense amplifier in 1 μsec or less, and then latched by data registers (latch circuits) LA1H to LA8H. The latched data is supplied to the I/O bus 14 through the column gate transistors CG1H to CG8H by a byte data read operation and then outside the memory chip from the buffer circuit 15.

In the data management information write mode, data management information has to be input to a predetermined latch circuit first. According to the embodiment of the present invention, directly after 256-byte data storage information is input from outside via the I/O buffer circuit 15, data management information of one byte is consecutively input and latched in the latch circuit. The potentials of eight bit lines of the data management information storage area 102 are determined on the basis of the above input data, and the data management information is written to a memory cell selected by a word line, together with the 256-byte data storage information.

The erasure of data management information of the data management information storage area 102 and that of data of the data storage area 101 are performed at the same time. As is illustrated in FIG. 9, the memory cells of the data management information storage area are formed on the P-type well region 22, as are those of the data storage area. In the erase mode, therefore, the substrate potentials of the memory cells of the area 102 are set to $V_{pp}$, as are those of the memory cells of the area 101.

Since the potentials of word lines WL1 to WL16 of a selected erase block are set to 0 V, the data of the memory cells of the data management information storage area 102 whose gates are connected to the word lines WL1 and WL2, is also erased. The voltages of all the word lines of non-selected blocks are set to $V_{pp}$. Thus, data of the memory cells of the non-selected blocks are not erased but still maintained.

In the foregoing nonvolatile semiconductor memory, the write/erase operation of memory cells of the data management information storage area 102 and that of memory cells of the data storage area are performed at the same time.

Thus, the foregoing memory eliminates the prior art problem wherein the number of times of rewrite of the memory cells of the area 102 increases, and the lifetime of the memory chip is determined by the increase in the number of times of rewrite. Furthermore, the speed at which the data management information is read out can be set ten or more times higher than the speed at which the stored data is read out. It is thus possible to shorten the retrieval time of a header, which was conventionally about 6 msec.

Figure 13:
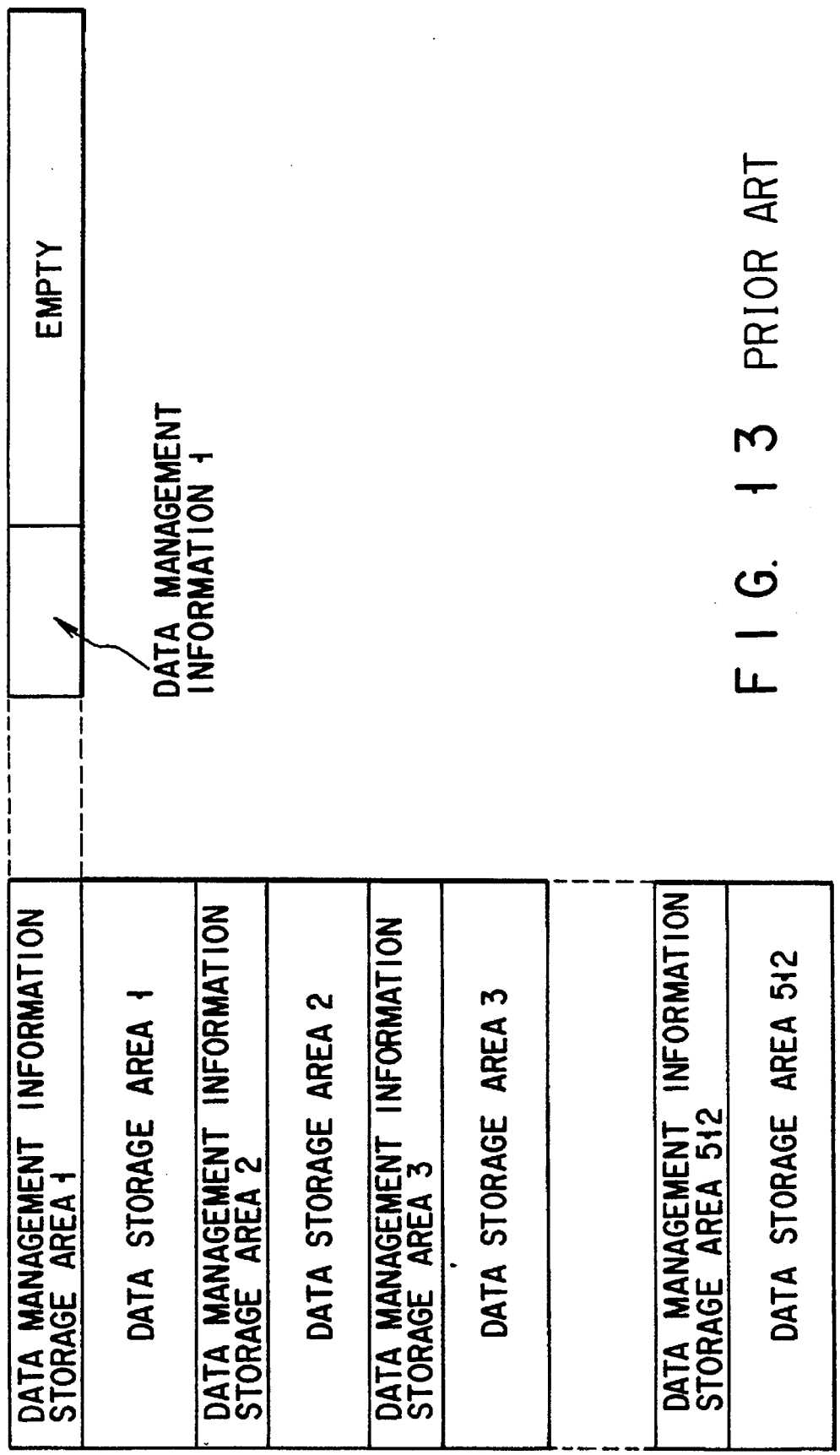
FIG. 13 is a view showing a prior art method of managing data stored in a memory.

Let us consider the retrieval time of a header in the case where 16-byte data management information is stored in the same data storage area of 4 K-bytes as that of the prior art shown in FIG. 13. In this case, the data management information storage area is constituted by 8 bytes (64 bit lines) in the column direction, and 64 sense amplifiers and 64 latch circuits corresponding to the bit lines are arranged. If the read time of data management information is about 1 μsec, the retrieval time of header is 2.867 msec=1 μsec×4 pages×512 blocks+100 nsec×4 bytes×4 pages×512 blocks, and it is less than half of 5.93 msec of the prior art shown in FIG. 13.

Figure 11:
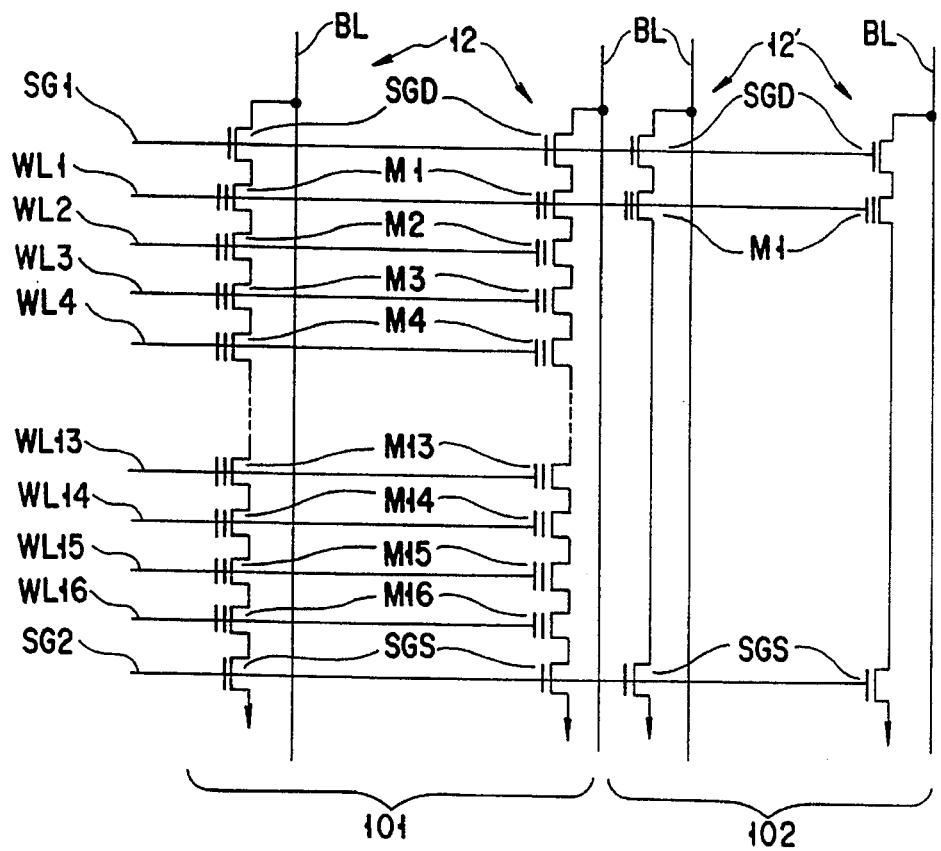
FIG. 11 is a view showing in detail one block of a memory cell of FIG. 2.
Figure 12:
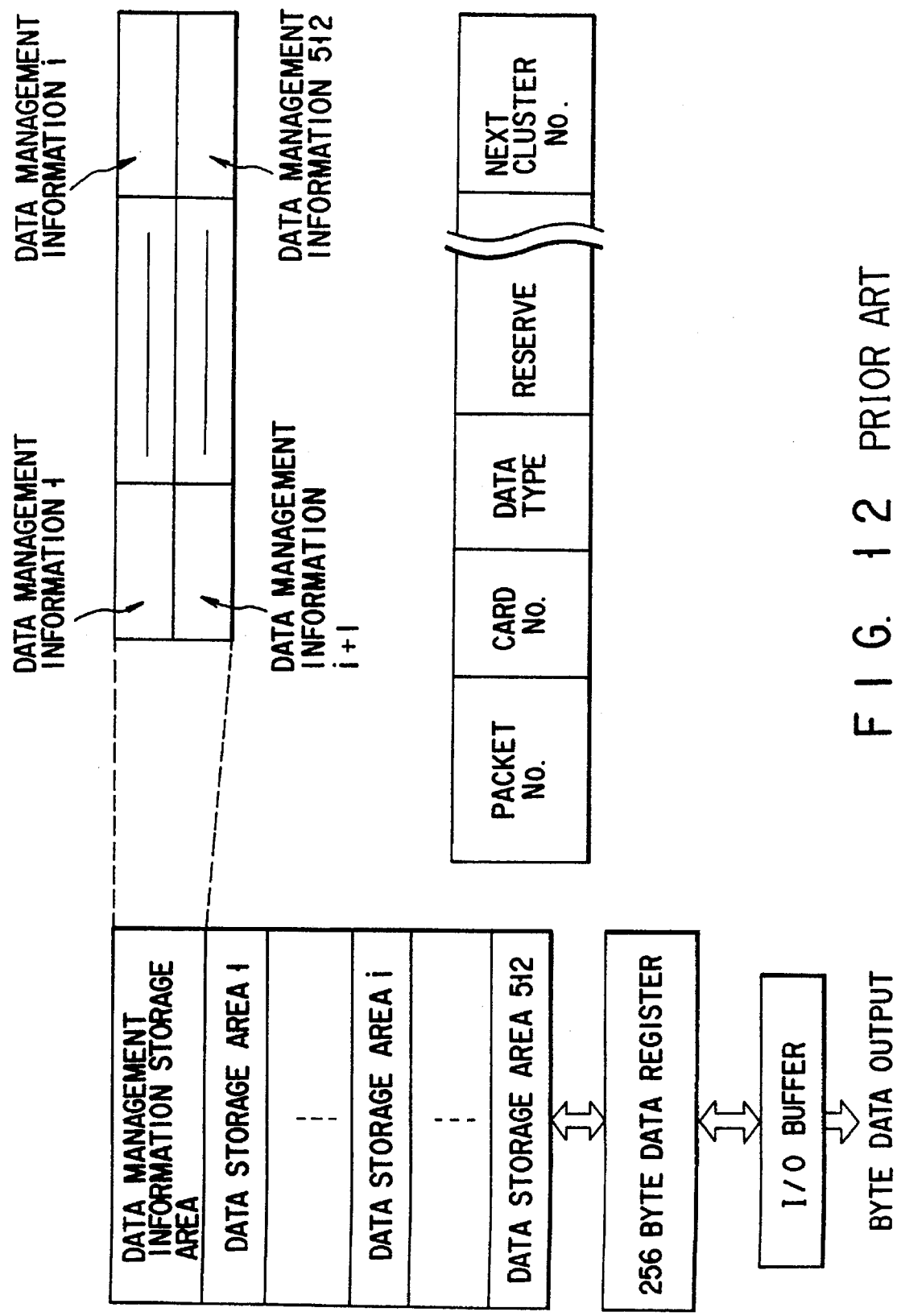
FIG. 12 is a view showing a prior art method of managing data stored in a memory.

In order to achieve a high-speed operation, the NAND string 12' of the data management information storage area 102 has only to be constituted of one memory cell M1 and select gate transistors SGD and SGS, as shown in FIG. 11.

According to the graph of FIG. 10, when the number of memory cells in a NAND string is one, the read time can be reduced to 200 nsec. Considering the retrieval time of header in the same manner as above, it is 0.92 msec=200 nsec×512 blocks+100 nsec×16 bytes×512 blocks, which is about 15% of that of the prior art.

As described above, the nonvolatile semiconductor memory of the present invention has the following advantage.

Since the data management information storage area is formed contiguous to the data storage area, and one memory cell of a NAND string of the data storage area and that of a NAND string of the data management information storage area in one block are selected at the same time, the number of times of rewriting of memory cells in the data management information storage area can be equal to that in the data storage area, and the lifetime of chips can be lengthened without relying upon the number of times of rewriting in the data management information storage area.

Furthermore, since the number of memory cells in one NAND string of the data management information storage area is set smaller than that in the data storage area, data of the data management information storage area can be read out at high speed and retrieved in a short time. The read, write and erase operations can be performed at high speed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory comprising:
   a first bit line;
   a second bit line;
   a plurality of select gate lines;
   a source line;
   a memory cell array comprising a plurality of first NAND strings in a first memory cell area and a plurality of second NAND strings in a second memory cell area, each of the first NAND strings comprising a select gate transistor and i nonvolatile memory cells, which are connected in series between said first bit line and said source line, each of the second NAND strings comprising a select gate transistor and j nonvolatile memory cells, which are connected in series between said second bit line and said source line, said i nonvolatile memory cells being greater in number than said j nonvolatile memory cells; and decoding means for selecting those of said first NAND strings and those of said second NAND strings, which are connected to a selected one of said select gate lines.

2. The nonvolatile semiconductor memory according to claim 1, wherein said first NAND strings constitute a first memory cell array and said second NAND strings constitute a second memory cell array, and the first memory cell array and the second memory cell array are contiguous to each other.

3. The nonvolatile semiconductor memory according to claim 1, further comprising a plurality of first word lines each connected to those of said nonvolatile memory cells of said first and second NAND strings, which are arranged in a row, and a plurality of second word lines each connected only to those of said nonvolatile memory cells of said first NAND strings, which are arranged in a row.

4. The nonvolatile semiconductor memory according to claim 2, further comprising a plurality of first word lines each connected to those of said nonvolatile memory cells of said first and second NAND strings, which are arranged in a row, and a plurality of second word lines each connected only to those of said nonvolatile memory cells of said first NAND strings, which are arranged in a row.

5. The nonvolatile semiconductor memory according to claim 4, wherein said first memory cell array is interposed between said decoding means and said second memory cell array, and said first word lines extend from said decoding means to said second memory cell array and said second word lines extend from said decoding means and terminate at the first memory cell array.

6. The nonvolatile semiconductor memory according to claim 5, further comprising means for performing read, write and erase operations simultaneously with respect to said nonvolatile memory cell of one of said first and second memory cell arrays selected by said decoding means.

* * * * *